(12) United States Patent
McGregor et al.

(10) Patent No.: US 7,749,645 B2
(45) Date of Patent: Jul. 6, 2010

(54) ELECTROCHEMICAL CELL STRUCTURE AND METHOD OF FABRICATION

(75) Inventors: Barry M. McGregor, Cambridgeshire (GB); Masaya Ishida, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 873 days.

(21) Appl. No.: 11/598,670

(22) Filed: Nov. 14, 2006

(65) Prior Publication Data
US 2007/0122933 A1  May 31, 2007

(30) Foreign Application Priority Data
Nov. 25, 2005  (GB) ................. 0524071.8

(51) Int. Cl.
*H01M 6/30* (2006.01)
(52) U.S. Cl. ................. 429/111; 427/74; 427/75; 427/419.2
(58) Field of Classification Search ................. 429/111; 427/74, 75, 402, 419.2
See application file for complete search history.

(56) References Cited

U.S. PATENT DOCUMENTS

| | | | |
|---|---|---|---|
| 4,927,721 A | 5/1990 | Gratzel et al. | |
| 5,830,597 A | 11/1998 | Hoffmann et al. | |
| 6,310,282 B1 | 10/2001 | Sakurai et al. | |
| 6,994,893 B2 | 2/2006 | Spreitzer et al. | |
| 2004/0025934 A1 | 2/2004 | Chittibabu et al. | |
| 2006/0127592 A1 | 6/2006 | Spreitzer et al. | |

FOREIGN PATENT DOCUMENTS

| | | |
|---|---|---|
| EP | 0 855 726 A1 | 7/1998 |
| EP | 1 020 881 A2 | 7/2000 |
| EP | 1 231 619 A3 | 8/2002 |

(Continued)

OTHER PUBLICATIONS

Henrik Lindstrom et al., "A New Method for Manufacturing Nanostructured Electrodes on Plastic Substrates," Nano Letters, vol. 1, No. 2, pp. 97-100, 2001.

(Continued)

*Primary Examiner*—Patrick Ryan
*Assistant Examiner*—Thomas H. Parsons
(74) *Attorney, Agent, or Firm*—Oliff & Berridge, PLC

(57) ABSTRACT

An electrochemical cell and a method of manufacturing the same are provided. The electrochemical cell comprises: a first conductive layer; a metal oxide layer provided on the first conductive layer, the metal oxide layer comprising a plurality of adjacent metal oxide cells, spaced from one another; a functional dye layer provided on the metal oxide layer; a second conductive layer; an electrolyte layer provided between the functional dye layer and the second conductive layer, wherein at least one of the first and second conductive layers is transparent; and wherein the functional dye layer is formed from an organic solvent ink. In another embodiment, the electrochemical cell comprises: a first conductive layer; a metal oxide layer provided on the first conductive layer; a functional dye layer provided on the metal oxide layer; a second conductive layer; and an electrolyte provided between the functional dye layer and the second conductive layer, wherein at least one of the first and second conductive layers is transparent; and wherein the functional dye layer is formed from a binary solvent ink, comprising a first solvent and a second solvent.

12 Claims, 4 Drawing Sheets

FOREIGN PATENT DOCUMENTS

| | | |
|---|---|---|
| EP | 1 271 227 A1 | 1/2003 |
| EP | 1 375 428 A1 | 1/2004 |
| EP | 1 672 653 A2 | 6/2006 |
| JP | A 2002-93476 | 3/2002 |
| JP | A 2005-135902 | 5/2005 |
| WO | WO 02/072714 A1 | 9/2002 |
| WO | WO 03/001288 A2 | 1/2003 |
| WO | WO 03/065392 A2 | 8/2003 |

OTHER PUBLICATIONS

Satoshi Uchida et al., "Preparation of TiO2 Nanocrystalline Electrode for Dye-Sensitized Solar cells by 28 GHz Microwave Irradiation," Solar Energy Materials & Solar Cells 81 (2004) 135-139.

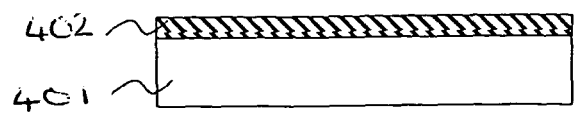
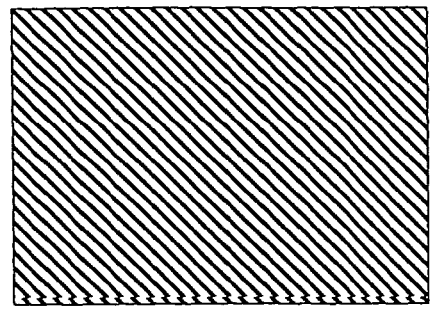
FIGURE 5A
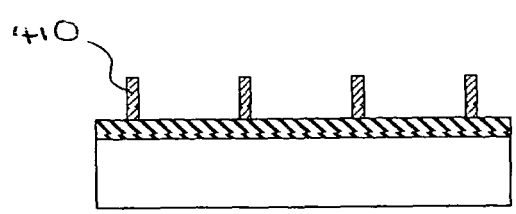
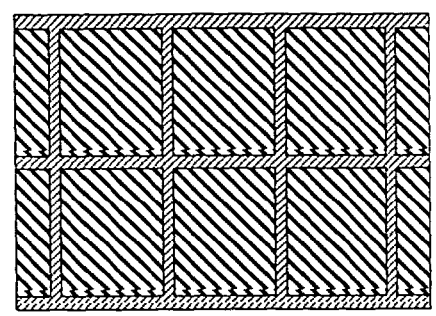
FIGURE 5B
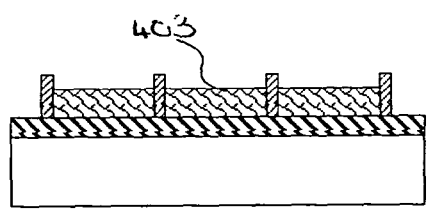
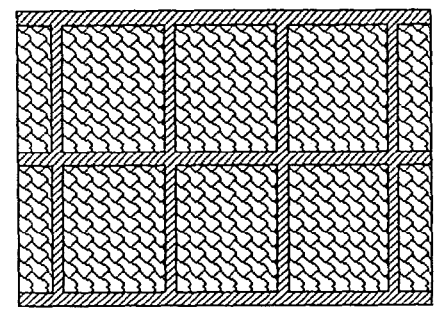
FIGURE 5C
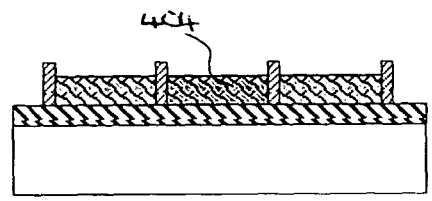
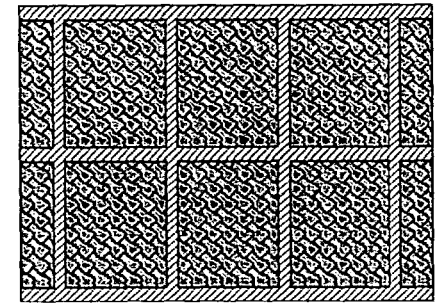
FIGURE 5D
FIGURE 5

ELECTROCHEMICAL CELL STRUCTURE AND METHOD OF FABRICATION

FIELD OF THE INVENTION

The present invention relates to an electrochemical cell structure and a method of fabrication. Preferably, the present invention relates to an ink used in the generation of a coloured electrochemical cell structure.

BACKGROUND OF THE INVENTION

The International Energy Agency's "World Energy Outlook" predicts that global primary energy demand will increase by 1.7% per year from 2000 to 2030. It also predicts that 90% of this demand will be met by fossil fuels. Consequently, there will be a 1.8% per year increase in carbon dioxide from 2000 to 2030, reaching 38 billion tonnes in 2030. Cleaner, renewable energy sources, including solar cells, have long been heralded as counters to this increased pollution trend. While advanced silicon based solar cells are now widely commercially available, their uptake has been slow due to high production costs, a lack of robustness and associated visual pollution resulting from the large surface exposure requirements.

Dye Sensitised Solar Cells (DSSC) are an alternative to crystalline solar cells that are cheaper than crystalline solar cells to produce. However, DSSC's are less efficient than crystalline solar cells. Therefore DSSC's require significant area coverage to be effective power generators.

U.S. Pat. No. 4,927,721 entitled "Photo-Electrochemical Cell", by M Gratzel et al. discloses a typical DSSC. As illustrated in FIG. 1, the DSSC 10 comprises a first transparent insulating layer 1; a first transparent conductive oxide (TCO) electrode layer 2; a transparent metal oxide layer 3 of titanium dioxide ($TiO_2$); a molecular monolayer of sensitiser (dye) 4; an electrolyte layer 5; a second transparent conductive oxide (TCO) electrode layer 6; and a second transparent insulating layer 7.

A DSSC generates charge by the direct absorption of visible light. Since most metal oxides absorb light predominantly in the ultra-violet region of the electromagnetic spectrum, a sensitiser (dye) 4 is absorbed onto the surface of metal oxide layer 3 to extend the light absorption range of the solar cell into the visible light region.

In order to increase the amount of light that the metal oxide layer 3 and the sensitiser (dye) layer 4 can absorb, at least some portion of the metal oxide layer 3 is made porous, increasing the surface area of the metal oxide layer 3. This increased surface area can support an increased quantity of sensitiser (dye) 4 resulting in increased light absorption and improving the energy conversion efficiency of the DSSC to more than 10%.

An electrochromic display (ECD) is a relatively new electrochemical, bi-stable display. While the application is different to the DSSC, these devices share many physical attributes, illustrated in FIG. 1, exchanging the sensitiser (dye) layer 4 by an electrochromic material layer which undergoes a reversible colour change when an electric current or voltage is applied across the device; being transparent in the oxidised state and coloured in the reduced state.

When a sufficient negative potential is applied to the first transparent conductive oxide (TCO) electrode layer 2, whilst the second transparent conductive electrode oxide (TCO) layer 6 is held at ground potential, electrons are injected into the conduction band of the metal oxide semiconductor layer 3 and reduce the adsorbed molecules (the coloration process). The reverse process occurs when a positive potential is applied to the first transparent conductive oxide (TCO) electrode layer 2 and the molecules become bleached (transparent).

A single electrochromic molecular monolayer on a planar substrate would not absorb sufficient light to provide a strong colour contrast between the bleached and unbleached states. Therefore a highly porous, large surface area, nanocrystalline metal oxide layer 3 is used to promote light absorption in the unbleached state by providing a larger effective surface area for the electrochromophore to bind onto. As light passes through the thick metal oxide layer 3, it crosses several hundreds of monolayers of molecules coloured by the sensitiser (dye) 4, giving strong absorption.

Since the structure of both electrochemical devices is similar, we describe only the method of DSSC manufacture as an example. Equally, this process could be applied with little modification to the ECD manufacture.

In order to manufacture the DSSC 10 illustrated in FIG. 1, a metal oxide layer 3 of several microns thickness is deposited onto the first transparent conductive oxide (TCO) electrode layer 2, using any one of several techniques, such as screen printing, doctor blading, sputtering or spray coating a high viscosity paste. A typical paste consists of water or organic solvent based metal oxide nanoparticle suspensions (5-500 nm diameter), typically titanium dioxide ($TiO_2$), a viscosity modifying binder, such as polyethylene glycol (PEG), and a surfactant, such as Triton-X. Following deposition the paste is dried to remove the solvent, and then sintered at temperatures up to 450° C. This high temperature process modifies the metal oxide particle size and density, and ensures the removal of the organic binder constituents, such as polyethylene glycol (PEG) to provide a good conductive path throughout and a well defined material porosity. Sintering also provides good electrical contact between the metal oxide particles 3 and the first transparent conductive oxide (TCO) electrode layer 2.

After drying and cooling, the porous metal oxide layer 3 is coated with sensitiser (dye) 4 by immersion in a low concentration ($\leq 1$ mM) sensitiser (dye) solution for an extended period, typically 24 hours, to allow absorption of the sensitiser (dye) 4 onto the metal oxide layer 3 through a functional ligand structure that often comprises a carboxylic acid derivative. Typical solvents used in this process are acetonitrile or ethanol, since aqueous solutions would inhibit the absorption of the sensitiser (dye) 4 onto the surface of the metal oxide layer 3.

The first transparent conductive oxide (TCO) electrode layer 2, having the porous metal oxide layer 3 and sensitiser (dye) layer 4 formed thereon, is then assembled with the second transparent conductive oxide (TCO) electrode layer 6. Both electrode layers 2, 6 are sandwiched together with a perimeter spacer dielectric encapsulant to create an electrode-to-electrode gap of at least 10 µm, before filling with the electrolyte layer 5. The spacer material is most commonly a thermoplastic that provides an encapsulation seal. Once the electrolyte layer 5, which is most commonly an iodide/triiodide salt in organic solvent, is introduced, the DSSC is completed by sealing any remaining aperture with either a thermoplastic gasket, epoxy resin or a UV-curable resin to prevent the ingress of water and hence device degradation.

Most, if not all, of the materials used to fabricate the DSSC can be handled in air and also under atmospheric pressure conditions, removing the necessity for expensive vacuum processes associated with crystalline solar cell fabrication. As a result, a DSSC can be manufactured at a lower cost than a crystalline solar cell.

The ECD fabrication process is very similar to that for the DSSC, with several exceptions. The porous metal oxide layer 3 is often patterned by screen printing to provide a desired electrode image, allowing the device to convey information by colouring or bleaching selected regions. Additionally, the sensitiser (dye) layer 4 is replaced with an absorbed electrochromophore material layer. Furthermore, a permeable diffuse reflector layer, typically large particles of sintered metal oxide, can be positioned between the first and second electrode layers 2, 6 to increase the viewed image contrast.

U.S. Pat. No. 5,830,597, entitled "Method and Equipment for Producing a Photochemical Cell", by H Hoffmann also discloses a DSSC 100. As illustrated in FIG. 2, the DSSC 100 comprises a first substrate 101 of glass or plastic; a first transparent conductive oxide (TCO) layer 102; a titanium dioxide ($TiO_2$) layer 103, a dye layer 104; an electrolyte layer 105; a second transparent conductive oxide (TCO) layer 106; a second substrate 107 of glass or plastic; and insulating webs 108, 109. The insulating webs 108, 109 are used to form individual cells 110 in the DSSC 100.

An individual cell 110 formed between the insulating web 108 and the insulating web 109 is different from the adjoining individual cell 110 formed between the insulating web 109 and the insulating web 108. This is because the $TiO_2$ layer 103 and the electrolyte layer 105 are interchanged in each adjoining individual cell 110. Thus, the electrical polarity of the adjoining individual cells 110 is opposite. This alternate division of different layers results in the formation of conducting layers 111 from the electrically conductive layers 102 and 106, each conducting layer 111 connecting a positive (negative) pole of one individual cell 110 to the negative (positive) pole of an adjacent individual cell 110. The resultant structure provides a method of increasing the overall DSSC output voltage, without the necessity of incorporating a multi-layered structure.

U.S. Pat. No. 6,310,282B1, entitled "Photovoltaic Conversion Element and a Dye-Sensitising Photovoltaic Cell", by Sakurai et al. discloses a multi-colour DSSC 200. As illustrated in FIG. 3, the multi-colour DSSC 200 comprises a first transparent electrode layer 201; a transparent semiconductor layer 202 of $TiO_2$, sensitising dye absorption portions 203, 204, 205, 206, of four colours, absorbed on the surface of the transparent semiconductor layer 202; a carrier transport layer 207; a second transparent electrode layer 208; and auxiliary electrodes 209 attached to the first and second electrode layers 201, 208.

The multi-colour DSSC 200 is manufactured by covering the transparent semiconductor layer 202 with a mask having openings that coincide only with the red sensitising dye absorption portions 203, dipping the transparent semiconductor layer 202 in red sensitising dye for a predetermined period of time, removing the transparent semiconductor layer 202 from the red sensitising dye and removing the mask. Then covering the transparent semiconductor layer 202 with a mask having openings that coincide only with the green sensitising dye absorption portions 204, dipping the transparent semiconductor layer 202 in green sensitising dye for a predetermined period of time, removing the transparent semiconductor layer 202 from the green sensitising dye and removing the mask. Next covering the transparent semiconductor layer 202 with a mask having openings that coincide only with the blue sensitising dye absorption portions 205, dipping the transparent semiconductor layer 202 in blue sensitising dye for a predetermined period of time, removing the transparent semiconductor layer 202 from the blue sensitising dye and removing the mask. Finally, dipping the transparent semiconductor layer 202 in black sensitising dye for a predetermined period of time and removing the transparent semiconductor layer 202 from the black sensitising dye.

The multi-colour DSSC 200 would have poor picture quality with respect to dye bleeding through the transparent semiconductor layer 202 from the separate dye absorption portions 203, 204, 205, 206 and the lack of greyscale (contrast) control.

In order to improve the incident photon to current conversion efficiency and control the stability/reproducibility of the DSSC performance, it is important to precisely control the physical properties of the metal oxide layer, and hence the absorption of the sensitiser (dye) molecule. However, metal oxide layer fabrication using screen-printing often results in a ±5% film thickness variation caused by residual blocked or dirty screen cells, adhesion to the screen during separation from the substrate surface and trapped bubble expansion during drying, caused by the inability to completely outgas a viscous paste. Other methods, such as doctor-blading, also suffer from an inability to provide a well defined thick metal oxide layer without significant spatial deviations. Subsequent porosity and film quality deviations are therefore likely to occur throughout such metal oxide layers, resulting in a degradation of efficiency and image quality for the DSSC and ECD, respectively.

In the case of the ECD, screen-printing demands are further exacerbated by the requirement to create ever finer metal oxide layer features for higher quality images, i.e. increase the dots-per-inch (dpi) for a pixelated display. As the dpi increases, the smallest feature size becomes limited as the screen mesh size approaches the mesh partition width.

As a result, fabrication of an electrochemical device based on a functionally sensitised thick porous metal oxide layer, as for the DSSC and ECD, using the aforementioned fabrication techniques are inappropriate from the view points of device reproducibility and adaptability to large size device production.

SUMMARY OF THE INVENTION

The present invention aims to address the above mentioned problems of manufacturing electrochemical cells (DSSC's and ECD's) of the prior art, to improve the efficiency with which they are made and thus further decrease their costs. Additionally, the present invention aims to produce a multi-coloured electrochemical cell having improved picture quality with respect to blurring (bleeding) and greyscale (contrast) over that of the prior art.

In a first embodiment of the present invention an electrochemical cell is provided. The electrochemical cell comprising: a first conductive layer; a metal oxide layer provided on the first conductive layer, the metal oxide layer comprising a plurality of adjacent metal oxide cells, spaced from one another; a functional dye layer provided on the metal oxide layer; a second conductive layer; and an electrolyte provided between the functional dye layer and the second conductive layer, wherein at least one of the first and second conductive layers is transparent; and wherein the functional dye layer is formed from an organic solvent ink.

In one embodiment the organic solvent ink comprises a first solvent and a second solvent. In another embodiment the first solvent and the second solvent have different boiling points. In another embodiment the first solvent has a boiling point greater than a boiling point of the second solvent. In another embodiment the first solvent has a boiling point greater than substantially 150° C. In another embodiment the first solvent is 5% v/v of the organic solvent ink and the second solvent is 95% v/v of the organic solvent ink. In another embodiment the first solvent is less than 40% v/v of the organic solvent ink. In another embodiment the first solvent is 1,3-dimethyl-2-imidazolidinone and the second solvent is 3-methyl-2-oxazolidinone.

In a further embodiment the functional dye layer comprises at least two different coloured organic solvent inks, such that at least some of the plurality of adjacent metal oxide cell have different colours. In another embodiment at least one of the at least two different coloured organic solvent inks contributes to the electrochemical cell power generation. In another embodiment a depth of colour of the functional dye layer in at least one metal oxide cell is altered by altering a thickness of the metal oxide layer. In another embodiment a depth of colour of the functional dye layer in at least one metal oxide cell is altered by altering a size of droplets of the organic solvent ink formed thereon. In another embodiment a depth of colour of the functional dye layer in at least one metal oxide cell is altered by altering a number of droplets of the organic solvent ink formed thereon. In another embodiment a depth of colour of the functional dye layer in at least one metal oxide cell is altered by altering a concentration of the organic solvent ink formed thereon.

In one embodiment the electrochemical cell further comprises: separating means formed on the first conductive layer and surrounding each of the plurality of adjacent metal oxide cells. In another embodiment the separating means is a polymer pattern or a polyimide pattern. In another embodiment at least part of the separating means is hydro- and/or oleophobic and wherein the first conductive layer is hydro- and/or oleophilic. In another embodiment the separating means forms a matrix of cells on the first conductive layer. In another embodiment each of the metal oxide cells is substantially square shaped, substantially circular shaped, substantially hexagonal shaped or substantially rectangular shaped. In a further embodiment the separating means are banks.

In one embodiment the electrochemical cell further comprises: a reflector layer provided on the opposite side of the functional dye layer to the first conductive layer. In another embodiment the electrochemical cell further comprises: an electrocatalytic layer formed between the electrolyte and the second conductive layer. In another embodiment the electrocatalytic layer is any one of platinum, ruthenium, rhodium, palladium, iridium or osmium.

In one embodiment the electrochemical cell further comprises: a first insulating substrate on a side of the first conductive layer opposite to the metal oxide layer. In another embodiment the electrochemical cell further comprises: a second insulating substrate on a side of the second conductive layer opposite to the electrolyte. In another embodiment the first insulating substrate is glass or plastic. In another embodiment the metal oxide layer is a titanium dioxide layer. In another embodiment the metal oxide layer comprises particles of metal oxide, and wherein the functional dye layer is formed on a surface of the particles of the metal oxide layer. In another embodiment the first and second conductive layers are continuous layers. In another embodiment the first conductive layer is a transparent conductive oxide layer. In another embodiment the second conductive layer is a transparent conductive oxide layer. In another embodiment the electrochemical cell is a dye sensitised solar cell. In another embodiment the electrochemical cell is an electrochromic display. In another embodiment the functional dye layer is an electrochromophore layer.

In a second embodiment of the present invention an electrochemical cell is provided. The electrochemical cell comprising: a first conductive layer; a metal oxide layer provided on the first conductive layer; a functional dye layer provided on the metal oxide layer; a second conductive layer; and an electrolyte provided between the functional dye layer and the second conductive layer, wherein at least one of the first and second conductive layers is transparent; and wherein the functional dye layer is formed from a binary solvent ink, comprising a first solvent and a second solvent.

In one embodiment the first solvent and the second solvent have different boiling points. In another embodiment the first solvent has a boiling point greater than a boiling point of the second solvent. In another embodiment the first solvent has a boiling point greater than substantially 150° C. In another embodiment the first solvent is 5% v/v of the binary solvent ink and the second solvent is 95% v/v of the binary solvent ink. In another embodiment the first solvent is less than 40% v/v of the binary solvent ink. In another embodiment the first solvent is 1,3-dimethyl-2-imidazolidinone and the second solvent is 3-methyl-2-oxazolidinone.

In a further embodiment a depth of colour of the functional dye layer in at least one metal oxide cell is altered by altering a thickness of the metal oxide layer. In another embodiment a depth of colour of the functional dye layer in at least one metal oxide cell is altered by altering a size of droplets of the organic solvent ink formed thereon. In another embodiment a depth of colour of the functional dye layer in at least one metal oxide cell is altered by altering a number of droplets of the organic solvent ink formed thereon. In another embodiment a depth of colour of the functional dye layer in at least one metal oxide cell is altered by altering a concentration of the organic solvent ink formed thereon. In another embodiment the first conductive layer is transparent, and the electrochemical cell further comprises: a reflector layer provided on the opposite side of the functional dye layer to the first conductive layer.

In one embodiment the electrochemical cell further comprises: an electrocatalytic layer formed between the electrolyte and the second conductive layer. In another embodiment the electrocatalytic layer is any one of platinum, ruthenium, rhodium, palladium, iridium or osmium. In another embodiment the electrochemical cell further comprises: a first insulating substrate on a side of the first conductive layer opposite to the metal oxide layer. In another embodiment the electrochemical cell further comprises: a second insulating substrate on a side of the second conductive layer opposite to the electrolyte. In another embodiment the first insulating substrate is glass or plastic. In another embodiment the metal oxide layer is a titanium dioxide layer.

In a further embodiment the metal oxide layer comprises particles of metal oxide, and wherein the functional dye layer is formed on a surface of the particles of the metal oxide layer. In another embodiment the first and second conductive layers are continuous layers. In another embodiment the first conductive layer is a transparent conductive oxide layer. In another embodiment the second conductive layer is a transparent conductive oxide layer. In another embodiment the electrochemical cell is a dye sensitised solar cell. In another embodiment the electrochemical cell is an electrochromic display.

In a third embodiment of the present invention a method of forming an electrochemical cell is provided. The method comprising: forming a first conductive layer; forming a metal oxide layer on the first conductive layer, the metal oxide layer comprising a plurality of adjacent metal oxide cells, spaced from one another; forming a functional dye layer formed from an organic solvent ink on the metal oxide layer; forming a second conductive layer; and providing an electrolyte between the functional dye layer and the second conductive layer, wherein at least one of the first and second conductive layers is transparent.

In one embodiment the organic solvent ink comprises a first solvent and a second solvent. In another embodiment the first solvent and the second solvent have different boiling points. In another embodiment the first solvent has a boiling point greater than a boiling point of the second solvent. In another embodiment the first solvent has a boiling point greater than substantially 150° C. In another embodiment the first solvent is 5% v/v of the organic solvent ink and the second solvent is 95% v/v of the organic solvent ink. In another embodiment the first solvent is less than 40% v/v of the organic solvent ink. In another embodiment the first solvent is 1,3-dimethyl-2-imidazolidinone and the second solvent is 3-methyl-2-oxazolidinone.

In one embodiment the method further comprises: forming separating means on the first conductive layer surrounding each of the plurality of adjacent metal oxide cells. In another embodiment the metal oxide layer is inkjet printed onto the first conductive layer. In another embodiment the metal oxide layer is inkjet printed onto the first conductive layer in one step. In another embodiment the organic solvent ink is inkjet printed onto the adjacent metal oxide cells of the metal oxide layer. In another embodiment the first conductive layer is transparent, and the method further comprises: providing a reflector layer on the opposite side of the functional dye layer to said at least one transparent conductive layer.

In one embodiment the method further comprises: providing an electrocatalytic layer between the electrolyte and the second conductive layer. In another embodiment the method further comprises: forming the first conductive layer on a first insulating substrate, whereby the first insulating substrate and the metal oxide layer are on opposite sides of the first conductive layer. In another embodiment the method further comprises: forming the second conductive layer on a second insulating substrate, whereby the second insulating substrate and the electrolyte are on opposite sides of the first conductive layer.

In a fourth embodiment of the present invention a method of forming an electrochemical cell is provided. The method comprising: forming a first conductive layer; forming a metal oxide layer on the first conductive layer; forming a functional dye layer formed from a binary solvent ink comprising a first solvent and a second solvent on the metal oxide layer; forming a second conductive layer; and providing an electrolyte between the functional dye layer and the second conductive layer, wherein at least one of the first and second conductive layers is transparent.

In one embodiment the first solvent and the second solvent have different boiling points. In another embodiment the first solvent has a boiling point greater than a boiling point of the second solvent. In another embodiment the first solvent has a boiling point greater than substantially 150° C. In another embodiment the first solvent is 5% v/v of the binary solvent ink and the second solvent is 95% v/v of the binary solvent ink. In another embodiment the first solvent is less than 40% v/v of the binary solvent ink. In another embodiment the first solvent is 1,3-dimethyl-2-imidazolidinone and the second solvent is 3-methyl-2-oxazolidinone.

In a further embodiment the metal oxide layer is inkjet printed onto the first conductive layer. In another embodiment the metal oxide layer is inkjet printed onto the first conductive layer in one step. In another embodiment the binary solvent ink is inkjet printed onto the adjacent metal oxide cells of the metal oxide layer. In another embodiment the first conductive layer is transparent, and the method further comprises: providing a reflector layer on the opposite side of the functional dye layer to the at least one transparent conductive layer.

In one embodiment the method further comprises: providing an electrocatalytic layer between the electrolyte and the second conductive layer. In another embodiment the method further comprises: forming the first conductive layer on a first insulating substrate, whereby the first insulating substrate and the metal oxide layer are on opposite sides of the first conductive layer. In one embodiment the method further comprises: forming the second conductive layer on a second insulating substrate, whereby the second insulating substrate and the electrolyte are on opposite sides of the first conductive layer.

The method of fabrication of the electrochemical cell of the present invention, using inkjet printing, is advantageous over screen printing fabrication as format scaling (up or down) does not require re-investment in machine hardware. This is because inkjet fabrication is software controlled and the software can be reconfigured without the expense of commissioning new screens. Additionally, inkjet heads are significantly more durable, than patterned screens, as patterned screens last only approximately 100 uses.

Furthermore, the drop on demand placement enabled by inkjet fabrication is less wasteful than screen printing. Unlike conventional inkjet overwriting, where each deposited layer is dried and then printed over to produce a thick deposition, the inkjet flood filling technique, which doses a confined region with a large volume of liquid to provide the required deposit thickness, has been shown to produce fracture-free metal oxide layers. Moreover, the surface confinement used to enable flood filling, through the use of a bank structure, ensures long range uniform material distribution and therefore uniform and repeatable performance. Additionally, surface confinement through the use of a bank structure ensures enhanced picture quality by colour separation between the different coloured cells.

BRIEF DESCRIPTION OF THE DRAWINGS

Embodiments of the present invention will now be described by way of further example only and with reference to the accompanying drawings, in which:

FIG. 5 illustrates a process flow diagram for the fabrication of an electrochemical cell of the present invention;

DETAILED DESCRIPTION

Figure 1:
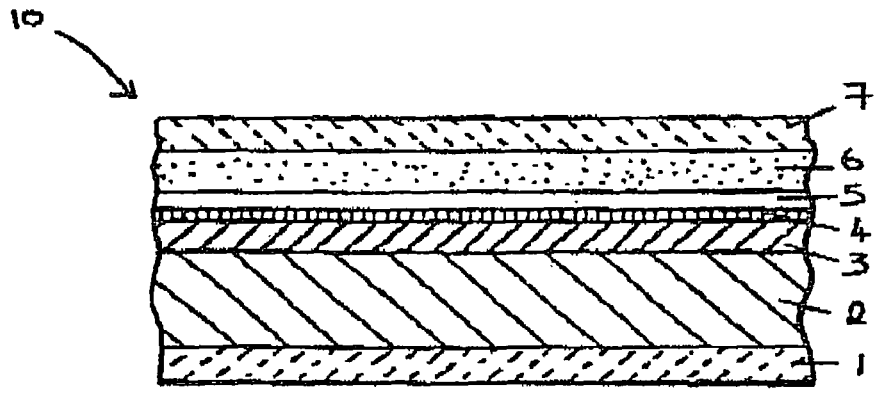
FIG. 1 illustrates a typical Dye Sensitised Solar Cell (DSSC) of the prior art.
Figure 2:
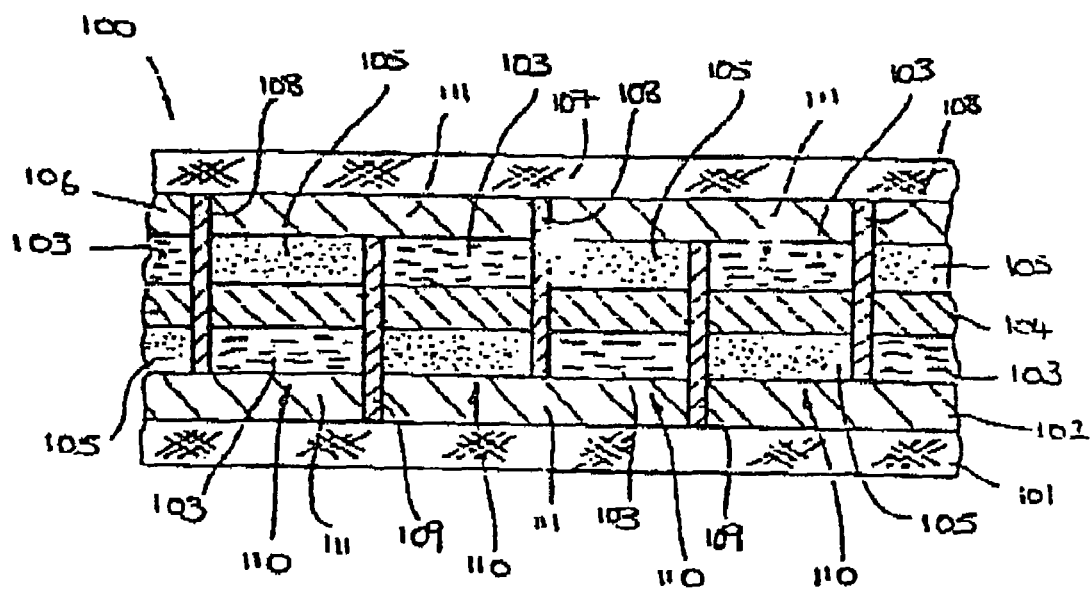
FIG. 2 illustrates a further DSSC of the prior art.
Figure 3:
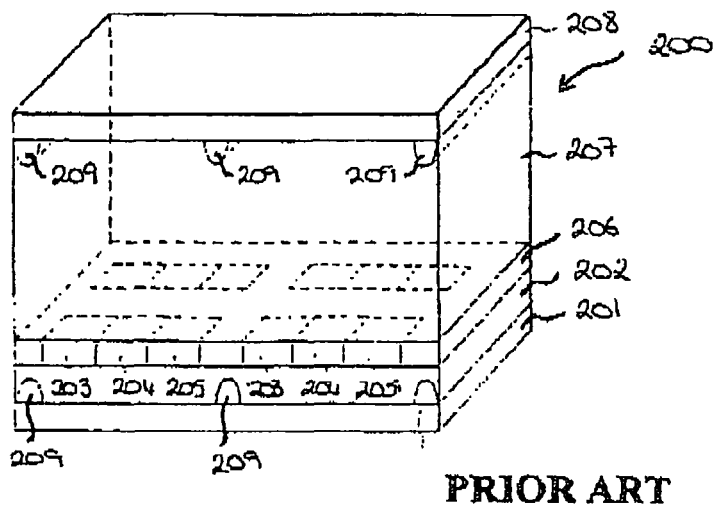
FIG. 3 illustrates a multi-colour DSSC of the prior art.
Figure 4:
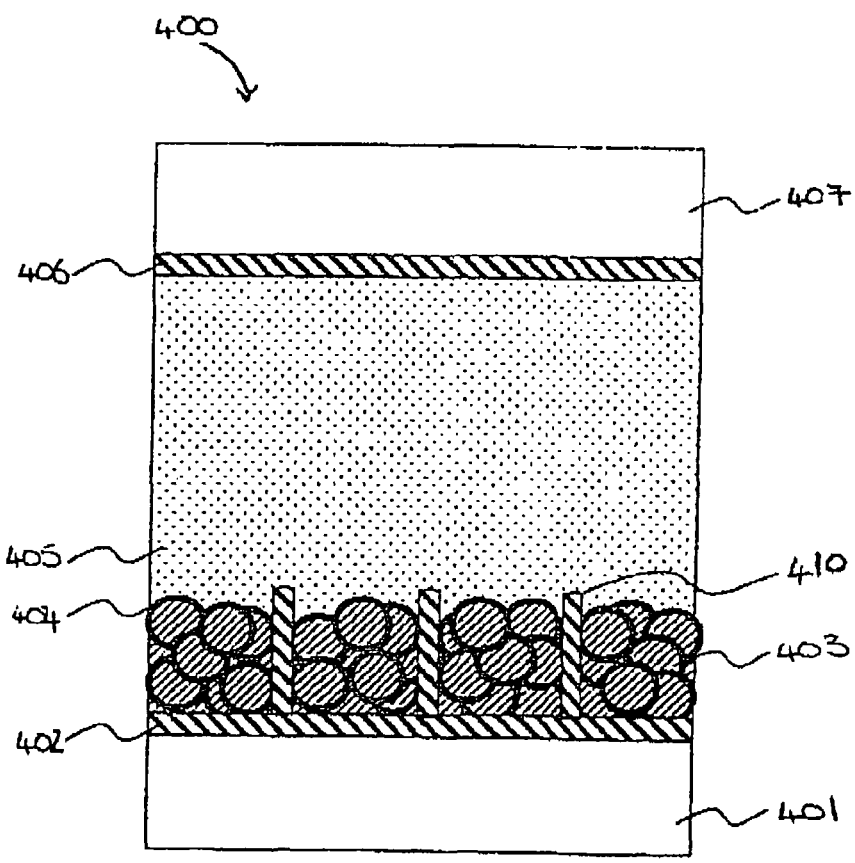
FIG. 4 illustrates an electrochemical cell of a first embodiment of the present invention.

The present invention relates to an electrochemical cell such as a Dye Sensitised Solar Cell (DSSC) or an electrochromic display (ECD). One electrochemical cell 400 of the present invention comprises, with reference to FIG. 4, a first transparent insulating substrate layer 401; a first transparent conductive oxide (TCO) electrode layer 402; a metal oxide layer 403; a sensitiser (dye)/electrochromic material layer 404; an electrolyte layer 405; a second TCO electrode layer 406; and a second transparent insulating substrate layer 407.

The first and second transparent insulating substrate layers 401, 407 are preferably glass or plastic. The metal oxide layer 403 is preferably titanium dioxide ($TiO_2$) and is a semiconductor.

The metal oxide layer 403 should preferably be a material which promotes intimate adhesion of the sensitiser (dye)/electrochromic material layer 404 on its surface. Additionally, the particles of the metal oxide layer 403 must be reasonably light transmissible. Particles greater then 500 nm are expected to be opaque and are not generally considered appropriate for use in the present invention. Such large particles would also tend to cause inkjet nozzle blocking.

In a first embodiment of the present invention, a bank structure 410 is formed on the first TCO layer 402, prior to the application of the metal oxide layer 403, so that a metal oxide layer 403 is formed of isolated cells. In one embodiment the bank structure 410 may be formed from a polymer or a polyimide.

Preferably, the bank structure is hydro- and/or oleophobic in some part while the TCO layer 402 is hydro- and/or oleophilic, depending on the nature of the metal oxide ink used to form the metal oxide layer 403.

The bank structure 410 can take on any desired shape forming a matrix of individual pixel cells on the first TCO layer 402, within which the isolated metal oxide cells are formed; such that no metal oxide bridges the bank structure 410 to cause short circuiting.

When the electrochemical cell is an ECD, it is essential that all the metal oxide cells (pixels) are electrically isolated from one another to control the image formation. While the metal oxide cell electrical isolation is not essential when the electrochemical cell is a DSSC, it is preferable to maintain a uniform metal oxide distribution throughout the active device area.

The ECD electrochemical cell can be considered as being composed of a plurality of micro-electrochemical cells, and different micro-electrochemical cells may have different coloured electrochromophore layers 404. Each micro-electrochemical cell is separated from the other micro-electrochemical cells, which together form the ECD, by the bank structure 410. Each micro-electrochemical cell is preferably between 20 μm to 500 μm across.

In a further embodiment of the present invention an electrocatalytic layer can be formed between the electrolyte layer 405 and the second TCO layer 406. The electrocatalytic layer is preferably greater than 2 nm thick and is selected to enhance the electrolyte regeneration. In the case of the DSSC, effective electrocatalytic metals can be selected from the platinum group metals; platinum, ruthenium, rhodium, palladium, iridium or osmium. The use of an electrocatalytic layer improves the overall performance of the electrochemical cell of the present invention.

The present invention also relates to a method of fabricating the electrochemical cell 400 of the present invention. FIG. 5 illustrates a process flow diagram for the fabrication of the electrochemical cell 400 of the present invention.

The TCO layer 402 is formed on the first transparent insulating substrate layer 401, FIG. 5a. Preferably, the TCO layer 402 has a sheet resistivity of 8-10 Ω.sq. and is made of indium tin oxide or fluorine doped tin oxide. Fluorine doped tin oxide is preferable due to its cheapness and inertness during the high temperature sintering stage.

The bank structure 410 is then fabricated on the TCO layer 402, FIG. 5b. In the first embodiment of the present invention, the bank structure 410 forms a matrix of square pixel cells. In order to form the bank structure 410 on the TCO layer 402, a photo-reactive polyimide source material is coated on to the TCO layer 402 and dried. A mask, in the shape of the matrix of pixel cells is then applied to the TCO layer 402. An ultraviolet (UV) light is irradiated through the mask to cause cross-linking of the polyimide in the exposed regions. The unexposed regions are removed by chemical developing, and the bank structure 410 is thermally cured at 350° C.

The TCO layer 402 having a bank structure 410 is then treated by oxygen or oxygen plus carbon tetrafluoride plasma to remove residual polyimide in the exposed regions. A carbon tetrafluoride ($CF_4$) plasma treatment is then applied to cause the polyimide bank structure 410 to become hydrophobic, while preserving the hydrophilic nature of the TCO layer 402.

The metal oxide layer 403 is then inkjet printed onto the TCO layer 402 having the bank structure 410 formed thereon. The metal oxide ink is jetted into each of the isolated pixel cells to form the metal oxide layer 403, FIG. 5c. Preferably, aqueous colloidal titanium dioxide ($TiO_2$) inks of concentration ≦10% volume fraction (v/v) are used, containing particles <500 nm in diameter. Other additives can be included in the metal oxide ink to ensure compatibility of the solution with the inkjet head. After deposition, the metal oxide layer 403 is dried and then sintered in air at ≧300° C.

Precise control of the metal oxide layer 403 thickness throughout the device area is essential to provide a uniform canvas on which the DSSC or ECD image can be formed. The thickness of the metal oxide layer 403 is controlled by the concentration of the aqueous colloidal $TiO_2$ ink, and the deposition volume. The resultant deviation in the peak thickness of the metal oxide layer 403 is less than 1.5% between pixel cells over a 50 $cm^2$ substrate area.

Sensitiser (dye) 404 is then inkjet printed into each of the pixel cells, onto the metal oxide layer 403 formed therein. This method of fabrication allows for the formation of different coloured pixel cells, by the application of different coloured sensitiser (dye) 404 to different pixel cells, in order to create a coloured image, with each pixel cell of the bank structure 410 corresponding to a pixel of a picture. Therefore, a high image quality electrochemical cell, with a resolution of 200 dots per inch (dpi) or greater, can be created. The different coloured sensitiser (dye) 404 is absorbed by the metal oxide layer 403, FIG. 5d. After immobilisation of the sensitiser (dye) 404, the excess sensitiser (dye) 404 and remaining solvent is removed by rinsing the complete structure in ethanol and blowing dry in nitrogen.

The first TCO layer 402, having the porous metal oxide layer 403 and sensitiser (dye) layer 404 formed thereon, is then assembled with the second TCO layer 406. Both electrode layers 402, 406 are sandwiched together with a perimeter spacer to create an electrode-to-electrode gap, before filling with the electrolyte layer 405. Once the electrolyte layer 405 is introduced, the DSSC is completed by sealing the remaining aperture.

If an electrocatalytic layer is desired in the electrochemical cell of the present invention, then the electrocatalytic layer is formed on the second TCO layer 406 prior to the electrode layers 402, 406 being sandwiched together.

An inkjet head is capable of providing a well defined aqueous colloidal metal oxide ink droplet, with volume deviation less than ±1.5%, to a precise location on the TCO layer 402. Moreover, this volumetric accuracy of ≦1.5% represents that for a commercial printer head. Several industrial heads and complementary techniques are available which can reduce this figure to ≦1%.

Inkjet deposition enables accurate positioning of the metal oxide on the TCO layer 402, within each pixel cell of the bank structure 410 as required. Thus, the thickness of the metal oxide layer 403 can be controlled precisely and a uniform porous metal oxide layer 403 can be obtained.

When at least part of the bank structure 410 is hydro- and/or oleophobic, and at least part of the TCO layer 402 is hydro- and/or oleophilic, the bank structure 410 repels the deposited metal oxide ink, thus correcting the final position of the deposited metal oxide ink droplets on the target surface and compensating for the inherent ±15 μm droplet lateral divergence from the inkjet nozzle axis. This repulsion is especially beneficial in the case of the ECD to prevent pixel short-circuits caused by metal oxide 403 bridging the bank structure 410. The bank structure 410 also enables the formation of a narrower gap between ECD pixels than otherwise permitted by the 30 μm spacing necessary for bank-less free-printing, enabling a higher active area ratio to be obtained in the ECD and increased image quality.

The metal oxide layer 403 should be several microns thick to function effectively. In traditional inkjet printing the thickness of the deposit is built up to the desired profile by using an overwriting technique, wherein each deposited layer is dried and sintered and then overwritten with another layer of ink, and so on, until the desired thickness is reached.

However, the method of the present invention uses a flood filling technique, whereby a large volume of metal oxide ink is introduced into each pixel cell of the bank structure 410 in one pass. The bank structure 410 prevents the metal oxide ink from spreading into neighbouring pixel cells. Using this process, only a single drying and sintering stage is required to produce the desired thickness of the metal oxide layer 403. The bank structure 410 also prevents the different coloured sensitiser (dye) 404 from spreading into neighbouring pixel cells, thus preventing colour bleeding.

The sensitiser (dye) ink solution is absorbed into the porous metal oxide layer 403 through capillary action. If the bank structure 410 was not used to separate the metal oxide layer 403 into isolated pixel cells, then upon jetting from an inkjet head the sensitiser (dye) 404 would spread throughout the metal oxide layer 403 and picture quality would be reduced.

Using a continuous metal oxide layer 403 makes control of image colour depth difficult by inkjet dye overwriting, as the deposited ink merely spreads throughout the porous metal oxide layer 403. To increase the resolution and contrast between the colours and to enable control of sensitiser (dye) 404 colour depth, the metal oxide layer 403 is separated into isolated pixel cells, so that sensitiser (dye) 404 introduced into one cell remains within that cell. Thus, the bank structure 410 is used to prevent lateral liquid diffusion.

Additionally, the use of the bank structure 410 enables the metal oxide layer 403 to have a uniform and repeatable cross-sectional profile throughout, assisting uniformity of colour depth across the image. To provide the required image quality, the pixel cells defined by the bank structure 410 should be as small as practicable.

In the case of the DSSC, not all of the coloured pixel cells are required to be coloured using sensitiser (dye) 404, however, at least some of the colours used in the image should preferably be coloured using sensitiser (dye) 404. The remainder pixel cells of the image can be fabricated using 'inert' dye that contributes to the image but not the electrochemical cell power generation. Though described as 'inert' dyes, they should chemically bond to the metal oxide layer 403 to provide good image stability. If only one coloured sensitiser (dye) 404 is used, black is preferable. This is because black sensitiser (dye) 404 has a high energy conversion efficiency.

However, it is preferable that all the pixel cells are coloured using sensitiser (dye) 404 that contributes to the electrochemical cell power generation to maximise power output. This is because the use of a plurality of isolated pixel cells reduces the energy conversion efficiency of the electrochemical cell of the present invention by area. Additionally, if only some of the pixel cells are coloured using sensitiser (dye) 404 that contributes to the electrochemical cell power generation, then the energy conversion efficiency of the electrochemical cell of the present invention is further reduced.

The depth of colour of the sensitiser (dye) 404 can be controlled through adjustment of the size and number of droplets printed into each pixel cell of the bank structure 410. Additionally, the depth of colour of the sensitiser (dye) 404 can be controlled through adjustment of the thickness of the metal oxide layer 403.

At least four inks are necessary to provide photographic quality images; cyan, magenta, yellow and black or red, green, blue and black depending on the image construction. Many of these coloured sensitisers (dyes) 404 already exist, i.e. $Ru^{11}(dmbpy)_2(dcbpy)Cl_2$ is a known yellow dye, N719 is a known purple/red dye and $Fe^{11}$ complexes are known blue dyes. To create a colour mix within one pixel cell, a predefined dose of one colour can be jetted into that pixel cell before being overwritten with a different dose of another colour.

Known DSSC immersive solutions comprise a dye dissolved in a low boiling point solvent in order to immobilise the dye molecules on a metal oxide surface. However, these solutions are not suitable for use with inkjet printing technology because the rapid evaporation of the solvent, that would occur at the inkjet head nozzle plate, can cause solute to build up around the nozzles causing them to eventually clog.

Furthermore, the volume of liquid that can be deposited on the device surface in a single pass by inkjet printing is very small, typically 0.5 nl/pixel, and would rapidly evaporate to dryness at room temperature if a low boiling point solvent was used; taking less than 10 seconds to completely dry. This timescale is too short compared to that required for the dye to be chemically absorbed on to the metal oxide surface, typically 24 hours. Hence, typical immersive dye solutions are unsuitable for inkjet deposition.

Alternatively, inkjet printable inks could be formed by dissolving the dyes in high boiling point solvents, alleviating the nozzle clogging and printed surface drying problems. However, high boiling point solvents are often harmful and typically viscous making them difficult to inkjet print. Their high viscosity could also reduce the penetration of the deposited ink into the metal oxide film. Furthermore, it would be difficult to remove the solvent from the device surface after the dye is fixed on the metal oxide surface without heating to temperatures that could damage the dye molecules.

Assuming that a "perfect solvent", with low viscosity, being easily removable, with a high boiling point, could be identified, then after printing, it would have to remain resident on the metal oxide surface long enough for the dye to chemisorb, typically 24 hours for a dye concentration of 0.3 mM. While this timescale is achievable, it is not advantageous for mass production, where each process step should be complete within minutes, rather than hours. One way of overcoming this problem is to increase the dye concentration. Literature reports have shown that the dye absorption time reduces from 24 hours to 10 minutes by increasing the dye concentration from 0.3 mM to 21 mM.

While such a high concentration ink would improve (reduce) the dye fixing time on the deposition surface, this conceptual ink would reduce the printed image greyscale graduation, in that 33 droplets of 0.3 mM ink would contain the same dye loading as 1 droplet of 10 mM concentration.

Hence, even if the "perfect solvent" could be found, the image quality would be significantly degraded due to the lack of greyscale control caused by having to use a high dye concentration to reduce the dye immobilization time on the metal oxide layer.

Therefore, in a preferred embodiment of the present invention, the sensitiser (dye) 404 is dissolved in a binary solvent solution to form inkjet printable inks; comprising a low boiling point bulk solvent and a high boiling point residual solvent. For example, a binary solvent ink may comprise 1 mM of N719 dye within 5% v/v of DMI (1,3-dimethyl-2-imidazolidinone) solvent and 95% v/v of NMO (3-methyl-2-oxazolidinone) solvent. NMO has a boiling point of 88° C. and DMI has a boiling point of 226° C.

Preferably, the residual solvent has a boiling point substantially greater than 150° C. Furthermore, preferably, the residual solvent is less than 40% v/v of the binary solvent ink.

When a binary solvent ink of the present invention is used in inkjet printing, following ejection of the binary solvent ink from a nozzle, the bulk solvent evaporates very quickly leaving behind the residual solvent on the surface. Since the residual solvent has a high boiling point, it remains liquid on the printed surface, ensuring that the dye has a prolonged period within which to bond with the metal oxide layer. Additionally, evaporation of the bulk solvent increases the dye concentration from approximately 1 mM to more than 10 mM, thereby reducing the dye absorption time, while preserving the inkjet greyscale control. In essence, the high concentration dye ink solution is formed on the target surface after printing. For instance, the above example of 1 mM N719 in 5% v/v DMI and 95% v/v NMO would be converted to 20 mM N719 in DMI after NMO evaporation from the printed surface.

The binary solvent inks of the present invention assist inkjet printing, in as much that they do not clog the nozzles of an inkjet head. This is because although the bulk solvent can be readily evaporated from the nozzle region, the residual solvent remains in liquid form and prevents the formation of dry solute around the nozzles.

Furthermore, the physical properties of the ink would be dominated by the bulk solvent, which possesses the lower boiling point and is more often less viscous than the higher boiling point residual solvent, making the composite ink much easier to tailor for inkjet printing.

Finally, the binary ink solution permits accurate greyscale graduation control unlike the case described for a single high boiling point solvent ink, since we are effectively able to print fractional droplet volumes. For example, printing one droplet of the 1 mM binary solvent ink described above is equivalent to printing 0.05 droplets of 20 mM dye in pure DMI.

The bulk solvent provides the necessary characteristics of the ink, whilst the residual solvent can be used to alter the concentration of the bulk solvent and enables the dye molecules to be immobilised on the surface of the metal oxide layer within a short process time. The process time of binary solvent inks, can be less than one tenth compared to the single solvent type inks. Furthermore, the use of a binary solvent ink provides stable ink ejection from an inkjet head.

Figure 7:
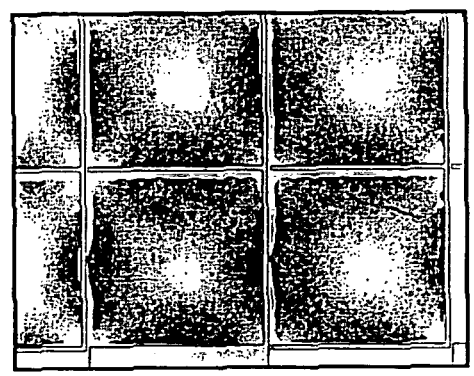
FIG. 7 illustrates a square pixel cell having a pyramidal metal oxide topography.

In the first embodiment of the present invention, the bank structure 410 comprises a matrix of square pixel cells as illustrated in FIG. 7. However, the pixel cells are not limited to being square. When the electrochemical cell 400 of the present invention is an ECD, square pixels are preferred as they are compatible with active matrix backplane fabrication technology. However, when the electrochemical cell 400 of the present invention is a DSSC, several different pixel cell shapes can be used, such as square, circular and hexagonal pixel cells.

Figure 6:
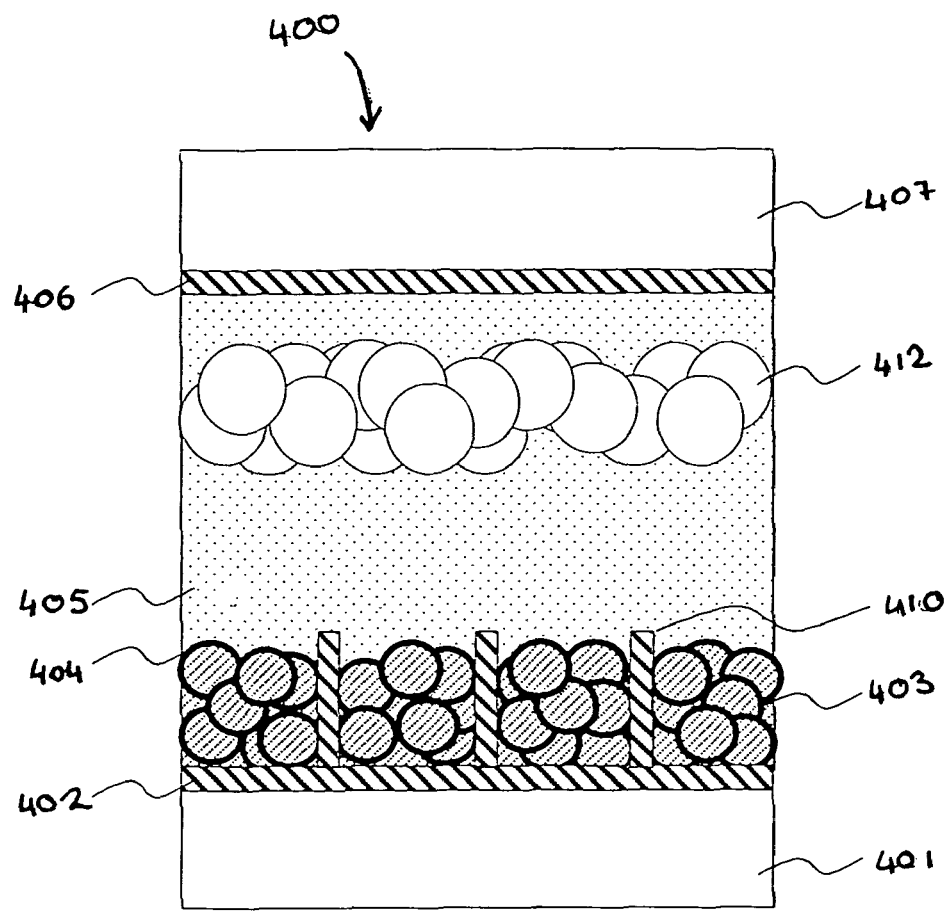
FIG. 6 illustrates an electrochemical cell of a second embodiment of the present invention.

In a further embodiment of the present invention an inert, diffuse, white reflector layer 412 can be provided between the sensitiser (dye) layer 404 and the second TCO layer 406, as illustrated in FIG. 6, to enhance the electrochemical cell image quality. The white reflector layer 412 provides a clear background against which the image can be viewed. The white reflector layer 412 also causes the light path through the sensitiser (dye) layer 404 to double, increasing the efficiency of the electrochemical cell. The white reflector layer 412 may be formed of large (micron order) $TiO_2$ particles. It will be clear that the white reflector layer can be provided in other locations to provide this effect. For example, if the second conductor layer and the corresponding substrate are transparent, the reflector layer may be provided behind the substrate or between the substrate and the conductor layer. In addition, although preferred, it is not necessary for the reflector layer to be white—other colours can be used instead, depending on the desired picture.

A bank structure 410 having a matrix of square pixel cells produces a quasi-pyramidal dry metal oxide topography as illustrated in FIG. 7, when the flood filling technique is used to fill each pixel cell with metal oxide ink. The bank structure 410 acts to confine the deposited metal oxide ink to a local region, within the pixel cells of the TCO layer 402. Without this confinement, the metal oxide ink would be distributed freely across the TCO layer 402 following deposition and would form a continuous metal oxide layer 403.

The bank structure 410 of the present invention increases the metal oxide layer's 403 ability to accommodate bending stress without fracturing, compared to a continuous metal oxide layer 403. This enables a flexible substrate 401 to be utilised, such as a plastic first insulating substrate 401.

In the first embodiment of the present invention, the bank structure 410 comprises a matrix of square pixel cells as illustrated in FIG. 9. However, the pixel cells are not limited to being square. When the electrochemical cell 400 of the present invention is an ECD, square pixels are preferred as they are compatible with active matrix backplane fabrication technology. However, when the electrochemical cell 400 of the present invention is a DSSC, several different pixel cell shapes can be used, such as square, circular and hexagonal pixel cells.

DSSC's of the present invention have been made with an energy conversion efficiency ($\eta$), an open circuit voltage ($V_{oc}$), a short circuit current ($I_{sc}$) and a fill factor (FF) of 5.0%, 0.48 V, 15 mA/cm$^2$ and 56%, respectively. The variation in energy conversion efficiency of a electrochemical cell of the present invention over a 50 cm$^2$ substrate area is less than 1.5%. This is due to the process stability of the inkjet fabrication method of the present invention.

Wider bank structures 410 are deleterious to both ECD operation, by a reduction in image quality, and DSSC operation, by a reduction in efficiency; resulting from a decrease in active area. Therefore, the bank structure 410 has a preferable width from 0.2 µm to 20 µm. 0.2 µm is the resolution limit for cost effective fabrication of the bank structure 410 by photolithography. 20 µm is considered the maximum effective bank structure 410 width before serious degradation of the image and performance becomes inhibitive, compared to the lowest common display resolutions of 72 dpi. Using inkjet technology hydrophilic pixel cell sizes less than 1 mm$^2$ are readily achievable, though lengths less than several hundred microns are preferred.

In the case of DSSC, absorption of light is proportional to the thickness of the porous metal oxide layer 403. If too thin, a fraction of the incident light will pass unhindered through the metal oxide layer 403, with a loss of potential efficiency.

If too thick, once all of the useful light has been completely absorbed, any remaining metal oxide layer 403 thickness will be redundant. Therefore, preferably the thickness of the deposited metal oxide layer 403 should be between from 0.5 µm to 20 µm.

Moreover, due to the uniformity of the thickness of the metal oxide layer 403 produced by inkjet printing over screen printing, the optimal metal oxide layer 403 thickness can be thinner when using inkjet printing.

Furthermore, in the case of screen printing, the ink viscosity must be much higher than that preferred for inkjet printing. Therefore, the material added to increase viscosity must be removed during the sintering process. Consequently, the as-deposited, pre-sintered metal oxide layer 403 thickness must be greater for screen-printing than for inkjet printing.

Although a bank structure 410 is used to form a matrix of isolated pixel cells on the TCO layer 402, prior to application of the metal oxide ink, the present invention is not limited to banks. Any method of forming isolated pixel cells on the TCO layer 402 may be used, such by creating troughs in the TCO layer 402.

Additionally, it is not essential for the first transparent conductive oxide layer 402 to be formed of an oxide material for the electrochemical cell of the present invention to function. Moreover, it is not essential for the second transparent conductive oxide layer 406 to be transparent or formed of an oxide material for the electrochemical cell of the present invention to function. Indeed, it is not essential to provide the second substrate (or either substrate in the finished device).

Any suitable material can be used for the bank structures. However, it is preferred to deposit them as a polymer, and more preferably as a polyimide, pattern.

The foregoing description has been given by way of example only and it will be appreciated by a person skilled in the art that modifications can be made without departing from the scope of the present invention.

The invention claimed is:

1. A method of forming an electrochemical cell that includes:
    a first conductive layer;
    a metal oxide layer disposed on the first conductive layer;
    a functional dye layer disposed on the metal oxide layer;
    a second conductive layer;
    an electrolyte disposed between the functional dye layer and the second conductive layer; and
    forming the functional dye layer formed from an ink including an organic solvent, the ink including a first solvent and a second solvent, wherein the first solvent is 5% v/v of the ink and the second solvent is 95% v/v of the ink.

2. The method of forming an electrochemical cell according to claim 1, wherein the first solvent and the second solvent have different boiling points.

3. The method of forming an electrochemical cell according to claim 2, wherein the first solvent has a boiling point greater than a boiling point of the second solvent.

4. The method of forming an electrochemical cell according to claim 1, wherein the first solvent has a boiling point greater than substantially 150° C.

5. The method of forming an electrochemical cell according to claim 1, wherein the first solvent is 1,3-dimethyl-2-imidazolidinone and the second solvent is 3-methyl-2-oxazolidinone.

6. The method of forming an electrochemical cell according to claim 1, further comprising:
    forming separating means on the first conductive layer surrounding each of a plurality of metal oxide cells included in the metal oxide layer.

7. The method of forming an electrochemical cell according to claim 1, further comprising:
    forming the metal oxide layer by an inkjet printing method.

8. The method of forming an electrochemical cell according to claim 7, wherein the forming of the metal oxide layer is carried out in one step.

9. The method of forming an electro chemical cell according to claim 1, wherein the forming of the functional dye layer is carried out by discharging droplets each of which includes the ink onto a plurality of metal oxide cells included in the metal oxide layer.

10. The method of forming an electrochemical cell according to claim 9, wherein the forming of the functional dye layer is carried out by an ink-jet method.

11. A method of forming an electrochemical cell having a first and second conductive layer, each with a side comprising the steps of:
    disposing a metal oxide layer on the first conductive layer;
    disposing a functional dye layer on the metal oxide layer; the functional dye layer being formed from an ink with an organic solvent, the ink including a first and second solvent, the first solvent being 5% v/v of the ink and the second solvent being 95% of the ink with the first solvent having a boiling point which is greater than 150° C. and is greater than a boiling point of the second solvent;
    disposing an electrolyte between the functional dye layer and the second conductive layer.

12. The method according to claim 11, wherein a bank structure extends from the side of the first conductive layer.

* * * * *